United States Patent [19]
Chen et al.

[11] Patent Number: 5,521,411
[45] Date of Patent: May 28, 1996

[54] TRANSISTOR SPACER ETCH PINPOINT STRUCTURE

[75] Inventors: Fusen E. Chen, Dallas; Frank R. Bryant, Denton; Girish A. Dixit, Dallas, all of Tex.

[73] Assignee: SGS-Thomson Microelectronics, Inc., Carrollton, Tex.

[21] Appl. No.: 271,565

[22] Filed: Jul. 7, 1994

Related U.S. Application Data

[63] Continuation of Ser. No. 816,627, Dec. 31, 1991, abandoned.

[51] Int. Cl.$^6$ .......................... H01L 29/76; H01L 29/94; H01L 31/062
[52] U.S. Cl. .......................... 257/344; 257/335; 257/368; 257/408
[58] Field of Search .................. 357/23.3, 23.4, 357/67, 41; 437/38; 257/335, 368, 344, 408

[56] References Cited

U.S. PATENT DOCUMENTS

| | | | |
|---|---|---|---|
| 4,419,810 | 12/1983 | Riseman | 257/344 |
| 4,873,557 | 10/1989 | Kita | 357/23.1 |
| 4,908,326 | 3/1990 | Ma et al. | 437/44 |
| 4,918,501 | 4/1990 | Komori et al. | 357/23.5 |
| 4,971,922 | 11/1990 | Watabe et al. | 437/44 |
| 4,978,634 | 12/1990 | Shen et al. | 437/52 |
| 5,079,617 | 1/1992 | Yoneda | 357/71 |
| 5,124,180 | 6/1992 | Proscia | 427/255.3 |
| 5,134,451 | 7/1992 | Katoh | 257/344 |
| 5,139,697 | 8/1992 | Togano et al. | 252/299.61 |

FOREIGN PATENT DOCUMENTS

| | | | |
|---|---|---|---|
| 6400761 | 1/1989 | Japan | 257/344 |

OTHER PUBLICATIONS

IBM Technical Disclosure Bulletin vol. 26, No. 3B, Aug. 1983 "Sidewall Oxide Structure And Method For Polysilicon Gate Devices to Minimize Consumption of Field Oxide", J. M. Blum, H. H. Chao, L. M. Ephrath, E. J. Petrillo and P. E. Sackles.

IBM Technical Disclosure Bulletin vol. 24, No. 2, Jul. 1981 "Method to Improve The Controllability of Lightly Doped Drain SiO$_2$ Spacer Formation", P. J. Tsang.

IEEE Electron Device Letters 10 (1989) Nov., No. 11, New York USA, "Submicron Salicide SMOS Devices with Self-Aligned Shallow/Deep Junctions", Chih-Yuan Lu, Janmye James Sung, and Chen-Hua D Yu.

IBM Technical Disclosure Bulletin vol. 32, No. 8A, Jan. 1990 "Method to Minimize Junction Capacitance Added by a Punch-Through (Halo) Implant".

*Primary Examiner*—Sara W. Crane
*Assistant Examiner*—Valencia Martin Wallace
*Attorney, Agent, or Firm*—Lisa K. Jorgenson; Kenneth C. Hill

[57] ABSTRACT

A method is provided for forming a transistor spacer etch endpoint structure of an integrated circuit, and an integrated circuit formed according to the same. A gate is formed over a portion of a substrate. A dielectric layer is formed over the integrated circuit and an oxide layer is formed over the dielectric layer. the oxide layer is patterned and etched to form sidewall oxide spacers on each side of the gate and over a portion of the dielectric layer. The dielectric layer not covered by the sidewall oxide spacers is then removed.

4 Claims, 1 Drawing Sheet

TRANSISTOR SPACER ETCH PINPOINT STRUCTURE

This is a continuation of application Ser. No. 07/816,627, filed Dec. 31, 1991, now abandoned.

1. Field of The Invention

The present invention relates generally to semiconductor integrated circuits, and more specifically to forming a transistor spacer endpoint structure.

2. Background of the Invention

In MOS technology, the gate of a transistor is the part of the device that controls the operation of the device. The formation of the gate has thus been of prime importance in maintaining the integrity and performance of the device. The typical gate of the transistor is formed from a doped polysilicon layer overlying a gate oxide layer. Lightly doped drain (LDD) regions are formed by implanting a dopant into the substrate adjacent to the gate. The implantation forms lightly doped, very shallow source/drain regions. A low temperature oxide (LTO) is formed over the surface of the wafer and anisotropically etched away. The oxide on the sidewalls of the polysilicon and gate oxide remains after this etch step to form sidewall spacers. More heavily doped source/drain regions are implanted into the substrate adjacent to the edge of the sidewall spacers. The gate does not overlap the more heavily doped source/drain regions.

The uniformity of the etched LTO to form the sidewall spacers is critical to the transistor performance for devices in the submicron feature sizes. Etching of the LTO must be carefully controlled to achieve a precise endpoint. Overetching of the LTO is a standard technique to insure complete removal of the oxide over the heavily implanted source/drain regions.

This overetching technique of the LTO, however, creates problems. Thicker field oxide regions which separate the active areas must be initially grown. As the LTO is etched to form the sidewall spacers, a portion of the field oxide is also etched away. Initially, forming thicker field oxide regions, however, forms longer birds beaks and causes greater physical stress to the substrate from the larger volume of field oxide. The additional stress leads to lattice strain and defects in the substrate. Additionally, variations of the overetch process can change the drive current of the transistor, thus directly impacting transistor performance.

One way to insure that device performance is maintained after overetching the LTO to form sidewall oxide spacers is to form a layer between the LTO and the field oxide region. Placing a spacer etch stop under the LTO which forms the spacers will prevent overetching the field oxide region and control the precise etch endpoint. It would therefore be desirable to provide a method which produces a reliable transistor having the desired sidewall oxide spacer structure using an etch stop layer under the spacer oxide layer. It would further be desirable for such technique to be easily adapted for use with standard integrated circuit fabrication process flows without increasing the complexity of the process.

SUMMARY OF THE INVENTION

The invention may be incorporated into a method for forming an integrated circuit, and the integrated circuit formed thereby, by forming a gate over a portion of a substrate. A dielectric layer is formed over the gate and a portion of the substrate. Oxide sidewall spacers are formed on the sides of the gate and on top of the dielectric layer.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION OF THE PREFERRED EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
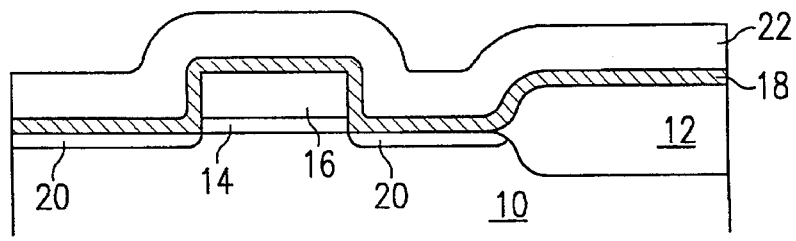
FIGS. 1–3 are cross-sectional views of the fabrication of a semiconductor device structure according to the present invention.

Referring to FIG. 1, an integrated circuit is to be formed on a silicon substrate 10. A field oxide region 12 is generally made in an area on the substrate as known in the art to separate active areas. A transistor gate is formed over a portion of the substrate 10. The gate electrode 16, preferably a doped polysilicon, is formed over a gate oxide 14 as known in the art. A dielectric layer 18 is deposited over the integrated circuit as known in the art to a depth of between approximately 50 to 2000 angstroms. Layer 18 is preferably a metal oxide layer such as aluminum oxide, titanium oxide or tantalum oxide. Layer 18, however, may be any dielectric which can be selectively etched over oxide.

Lightly doped drain (LDD) regions 20 may be formed in the substrate adjacent to the gate 16 either before or after the dielectric layer 18 is formed. The LDD regions 20 are formed by implanting a dopant such as phosphorus for N-type regions. This implant forms lightly doped, very shallow source/drain regions. An oxide layer 22 is next formed over the dielectric layer 18 as known in the art.

Figure 2:
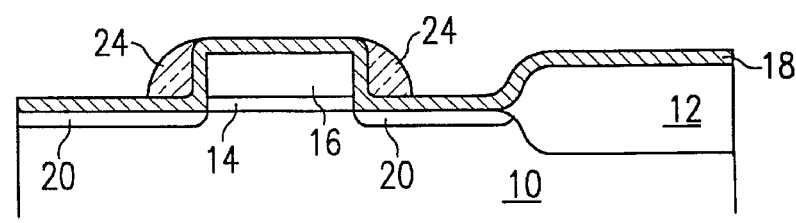

Referring to FIG. 2, oxide layer 22 is patterned and etched to form sidewall oxide spacers 24 adjacent to the sides of the gate 16 and on top of a portion of the dielectric layer 18. The oxide layer 22 is selectively etched, typically by a plasma etch, using the dielectric layer 18 as an etch stop. The dielectric layer will prevent any overetching, required to remove all of the oxide from the area where the LDD implant is made, from attacking the field oxide region. Thus, a thicker field oxide region is not required at the beginning of the process to accommodate a loss of a portion of the field oxide during overetch of the spacer oxide. Transistor performance can be maintained because the overetch will not attack the field oxide or the silicon substrate where the implants are made.

Figure 3:
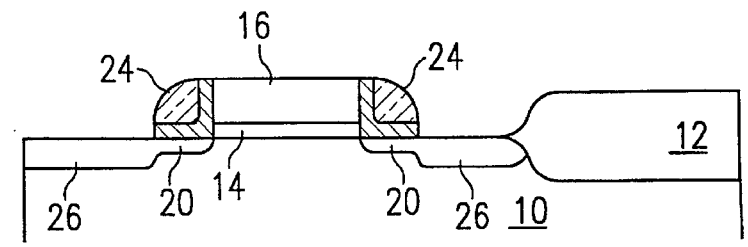

Referring to FIG. 3, The dielectric layer 18 is removed by a wet or dry etch process as known in the art. The dielectric is selectively etched to prevent any loss of the oxide sidewall spacers 24. A second implant is performed either before or after the dielectric layer is removed to form source/drain regions 26. This implant is a large dose of dopant such as arsenic or antimony forming $N^+$ regions adjacent to the sidewall oxide spacers 24. The sidewall oxide spacers act as a mask to insure that the heavy second implant only reaches the edges of the oxide spacers. As will be appreciated by those skilled in the art, p-channel transistors can also be made by the above described process.

As will be appreciated by those skilled in the art, the process steps described above can be used with nearly any conventional process flow. While the invention has been particularly shown and described with reference to a preferred embodiment, it will be understood by those skilled in the art that various changes in form and detail may be made therein without departing from the spirit and scope of the invention.

What is claimed is:

1. A structure consisting of a portion of a semiconductor integrated circuit, comprising:

a substrate;

a gate oxide layer over a portion of the substrate;

a gate electrode, formed from a conductive material, over the gate dielectric layer;

a titanium oxide layer on the sides of the gate electrode and a portion of the substrate adjacent to the gate electrode, wherein the metal oxide layer is in direct contact with the conductive material forming the gate electrode; and sidewall oxide spacers on the metal oxide layer adjacent to the sidewalls of the gate electrode.

2. The structure of claim 1, wherein the titanium oxide layer is in direct contact with the substrate in the portion adjacent the gate electrode.

3. A structure consisting of a portion of a semiconductor integrated circuit, comprising:

a substrate;

a gate oxide layer over a portion of the substrate;

a gate electrode, formed from a conductive material, over the gate dielectric layer;

a tantalum oxide layer on the sides of the gate electrode and a portion of the substrate adjacent to the gate electrode, wherein the-metal oxide layer is in direct contact with the conductive material forming the gate electrode; and sidewall oxide spacers on the metal oxide layer adjacent to the sidewalls of the gate electrode.

4. The structure of claim 3, wherein the tantalum oxide layer is in direct contact with the substrate in the portion adjacent the gate electrode.

* * * * *